a multi-bit cascaded sigma-delta A/D converter (40) has a higher resolution, higher sample rate, and lower harmonic distortion than previous multi-bit cascaded sigma-delta approaches. The A/D converter employs delaying switched capacitor integrators to relax settling time requirements and to thereby ease op amp design for multi-bit cascaded sigma-delta A/D converters. The converter has a true sample and hold input; the op amp amplifies a fixed amount of charge; and nodes are settled with the dc gain of the op amp, permitting greater settling accuracy.

United States Patent [19]
Powell et al.

[11] Patent Number: 5,274,374
[45] Date of Patent: Dec. 28, 1993

[54] ANALOG-TO-DIGITAL CONVERTER HAVING MULTI-BIT CASCADED SIGMA-DELTA LOOPS WITH DELAYING INTERGRATORS

[75] Inventors: Scott Powell, Carlsbad; Anthony Mellissinos, Encinitas, both of Calif.

[73] Assignee: Hughes Aircraft Company, Los Angeles, Calif.

[21] Appl. No.: 855,982

[22] Filed: Mar. 20, 1992

[51] Int. Cl.⁵ .......................................... H03M 3/04
[52] U.S. Cl. ..................................... 341/143; 375/26
[58] Field of Search .............. 341/143, 142, 139, 166, 341/172; 375/26, 27, 28, 33, 34

[56] References Cited

U.S. PATENT DOCUMENTS 5,148,166  9/1992  Ribner .................................. 341/143
5,159,341  10/1992  McCartney et al. ................. 341/143

OTHER PUBLICATIONS

"Architectures for High-Order Multibit Modulators" R. Walden et al. 1990 IEEE International Symposium of Circuits and Systems, May 1-3, 1990.

Primary Examiner—A. D. Pellinen
Assistant Examiner—Brian K. Young
Attorney, Agent, or Firm—W. C. Schubert; W. K. Denson-Low

[57] ABSTRACT

A multi-bit cascaded sigma-delta A/D converter (40) has a higher resolution, higher sample rate, and lower harmonic distortion than previous multi-bit cascaded sigma-delta approaches. The A/D converter employs delaying switched capacitor integrators to relax settling time requirements and to thereby ease op amp design for multi-bit cascaded sigma-delta A/D converters. The converter has a true sample and hold input; the op amp amplifies a fixed amount of charge; and nodes are settled with the dc gain of the op amp, permitting greater settling accuracy.

4 Claims, 3 Drawing Sheets

ANALOG-TO-DIGITAL CONVERTER HAVING MULTI-BIT CASCADED SIGMA-DELTA LOOPS WITH DELAYING INTERGRATORS

FIELD OF THE INVENTION

The invention relates to analog-to-digital converters and, more particularly, to high-resolution, high-speed analog-to-digital (A/D) converters.

BACKGROUND OF THE INVENTION

In conventional multi-bit cascaded sigma-delta A/D converters it is known that the resolution can be extended for several bits by providing a subtraction and gain stage in between cascaded sigma-delta loops. However, in the known two-phase switched capacitor implementations, the inputs to the gain stage must normally be valid on the same clock phase.

For example, Walden et. al in a paper entitled "Architectures for High-Order Multibit Sigma-Delta Modulators", *Proceedings* 1990 *ISCAS*, pp. 885–898, discloses such a previously-known device. In such devices as seen in this reference, in order to generate the inter-loop error signal the input and loop integrator amplifier output are required to be in phase. This in turn has heretofore required the use of a non-delaying integrator in the sigma-delta loops.

It has been found that, in analog-to-digital converters utilizing cascaded Sigma-Delta loops, the use of the known integrator circuits introduces problems in relation to pole error, settling accuracy, and higher gain-bandwidth requirements for the operational amplifiers.

It is therefore an object of the invention to provide a multi-bit cascaded sigma-delta analog-to-digital converter having higher resolution (number of bits), higher sample rate, and lower harmonic distortion than previous multi-bit cascaded sigma-delta approaches.

It is another object of the invention to provide a multi-bit cascaded sigma-delta A/D converter using delaying switched capacitor integrators.

It is yet another object of the invention to relax settling time requirements and to thereby ease operational amplifier (op amp) design constraints for multi-bit cascaded sigma-delta A/D converters.

It is still another object of the invention to provide a cascaded sigma-delta A/D converter wherein there is a true sample and hold input; the op amp amplifies a fixed amount of charge; nodes are settled utilizing the dc gain of the op amp (much higher than the high frequency gain) thus permitting greater settling accuracy.

SUMMARY OF THE INVENTION

The foregoing and other problems are overcome and the objects of the invention are realized by a method and apparatus which provides for inputs to a gain stage to be valid on opposite clock phases, thereby permitting the use of delaying switched capacitor integrating amplifiers in a sigma-delta loop.

In one aspect of the invention there is provided an analog-to-digital converter comprising a plurality of sigma-delta loops for converting a portion of an analog input to a quantized digital representation thereof, each loop including an integrating amplifier operative for converting an analog input to the loop, and the loop feedback, to a corresponding shaped analog representation of the analog input to the loop, minus the loop feedback; and a plurality of gain blocks, each gain block respectively connecting one pair of the plurality of loops. Each gain block includes an amplifier and a first capacitor switchably connected to the amplifier and operative for sampling an analog input on a first clock phase for providing a first input to the amplifier. Each gain block further includes a second capacitor switchably connected to the amplifier and operative for sampling a corresponding analog input on a second clock phase to provide a second input to the amplifier. The amplifier is connected to receive and operate upon the first and second inputs on a succeeding clock phase, whereby the respective inputs are placed in phase at the input to the integrating amplifier.

In another aspect, the invention provides a method for cascading loops of a sigma-delta A/D converter. The method includes the steps of (a) providing a plurality of sigma-delta loops, each loop comprising an analog-to-digital converter circuit which receives analog inputs and derives therefrom an analog output to be converted to a corresponding digital format; (b) sampling a value of the analog input of at least one of the loops on a first clock phase; and (c) sampling a value of the output of the at least one loop on a second clock phase. The method thereafter provides the sampled values as in-phase inputs to a gain amplifier whose output is connected as an input to a subsequent loop, whereby the sampled input and output values applied to said amplifier may be operated upon in phase.

It will thus be appreciated by those skilled in the art that, for a given technology, the known prior art devices will tend to operate more slowly and with reduced resolution (number of bits) compared to the novel method and apparatus disclosed herein.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
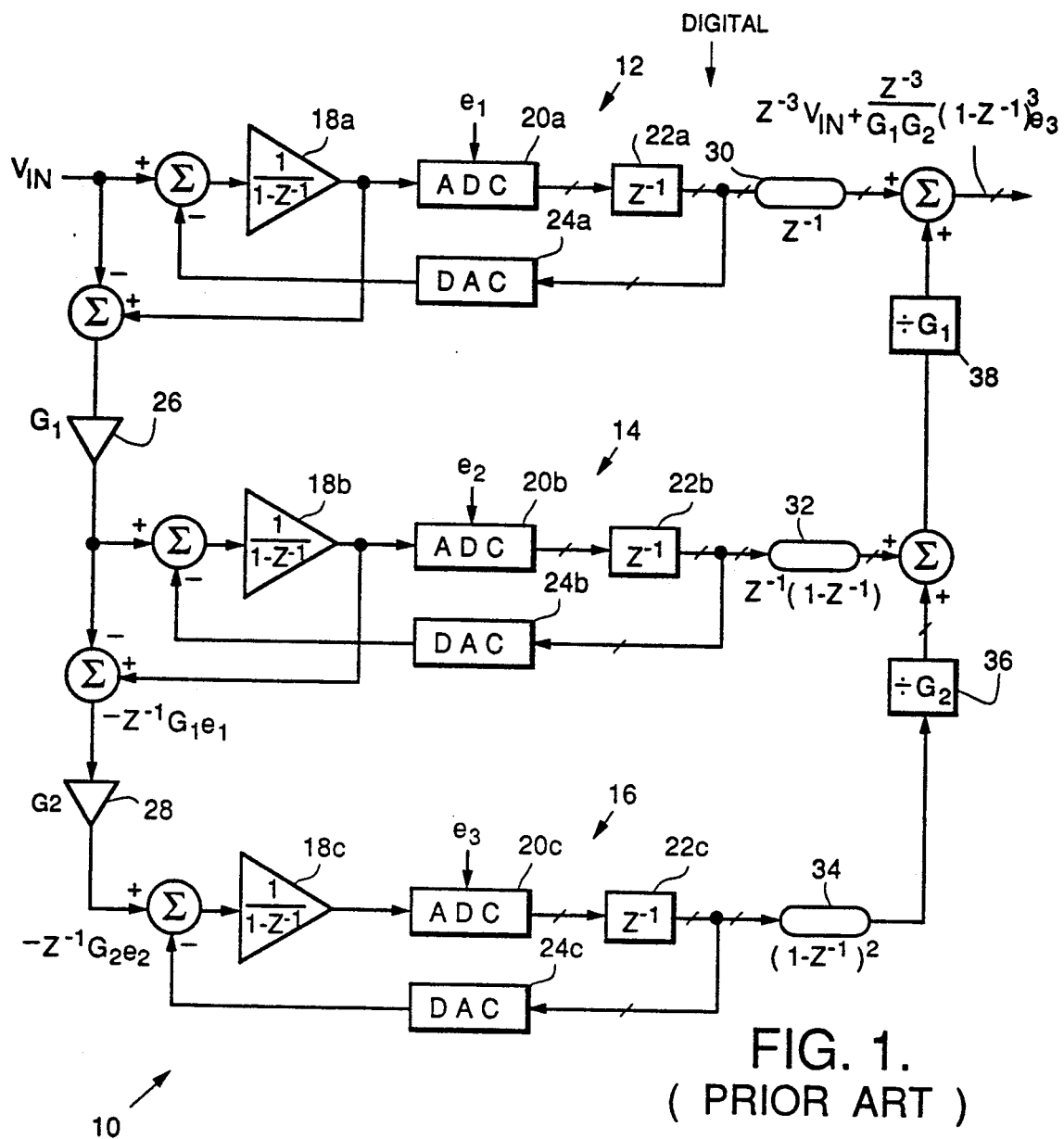
FIG. 1 is a block diagram showing a prior art cascaded sigma-delta A/D converter.

FIG. 1 is a block diagram illustrating a prior art implementation of a 3rd order multi-bit cascaded sigma-delta A/D. Timing details are not illustrated.

The A/D converter 10 shown in FIG. 1 comprises three cascaded first order sigma-delta loops, separately indicated at 12, 14, and 16.

An analog input voltage, $V_{in}$, is received at the input and applied in the first loop 12 to a high-gain operational amplifier or summing/integrating amplifier 18a whose output is fed to a conventional ADC circuit 20a where the amplifier output is converted to a digital output. The output of ADC circuit 20a is multiplied at 22a by $Z^{-1}$ and fed back to DAC circuit 24a where the new digital number is converted back to a "quantized" analog signal, which is then fed as an input to summing/integrating amplifier 18a.

The analog output from amplifier 18a is fed, along with the input value $V_{in}$, to amplifier 26 to provide a subtraction or difference input to the next loop 14.

It will be appreciated that the elements of loops 14 and 16 are substantially identical to those of loop 12 and consequently are simply labeled with the same number but with small b's and c's to distinguish them from those in the first loop. The difference output from loop 14 is fed through amplifier 28 to the input of loop 16.

The outputs of each loop are filtered, in known manner, in respective circuits shown at 30, 32, and 34 and suitably summed, after the gain of the stage has been divided out at respective blocks 36 and 38, to provide a high-resolution digital output representative of the analog input value $V_{in}$.

The operation is similar to a subranging A/D converter where the 2nd loop cancels the quantization noise of the 1st loop and the 3rd loop cancels the quantization noise of the second.

Overall, this known apparatus provides 3rd order noise shaping which has been additionally suppressed by the interstage gains.

It will be understood from FIG. 1 that the "quantization error voltage" introduced by transforming an analog signal to a digital signal, as at ADC circuits 20a,b, and c, is equal to the difference between the analog value and the nearest quantization level.

It will also be appreciated that in order to generate the inter-loop error signal in this known device, the input and integrator output are required to be in phase. This in turn has required the use of a non-delaying integrator in the sigma-delta loops.

Figure 2A:
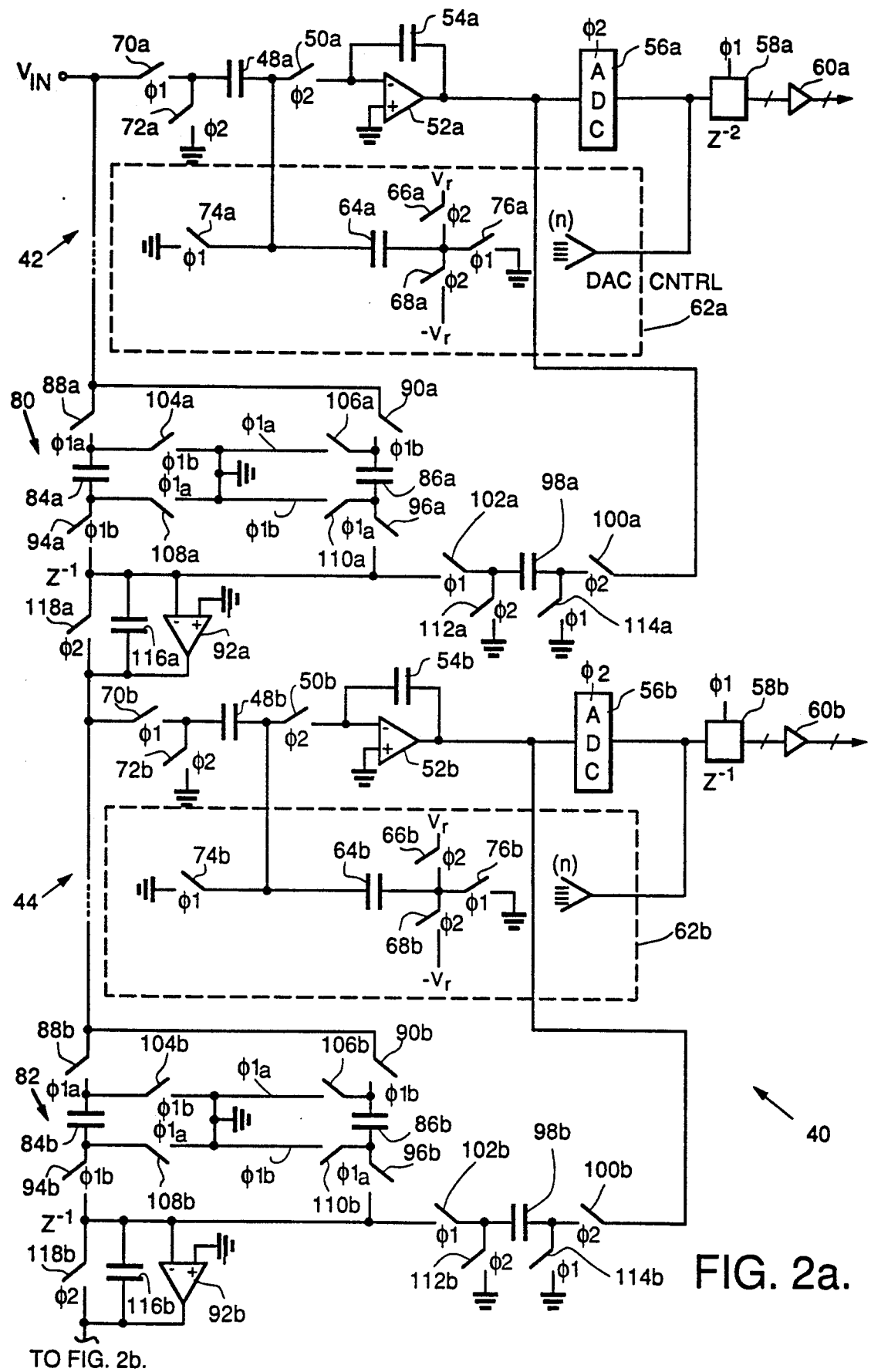
FIG. 2a and 2b are a schematic diagram showing the gain block circuits, in accordance with the invention, for cascading sigma-delta loops.
Figure 2B:
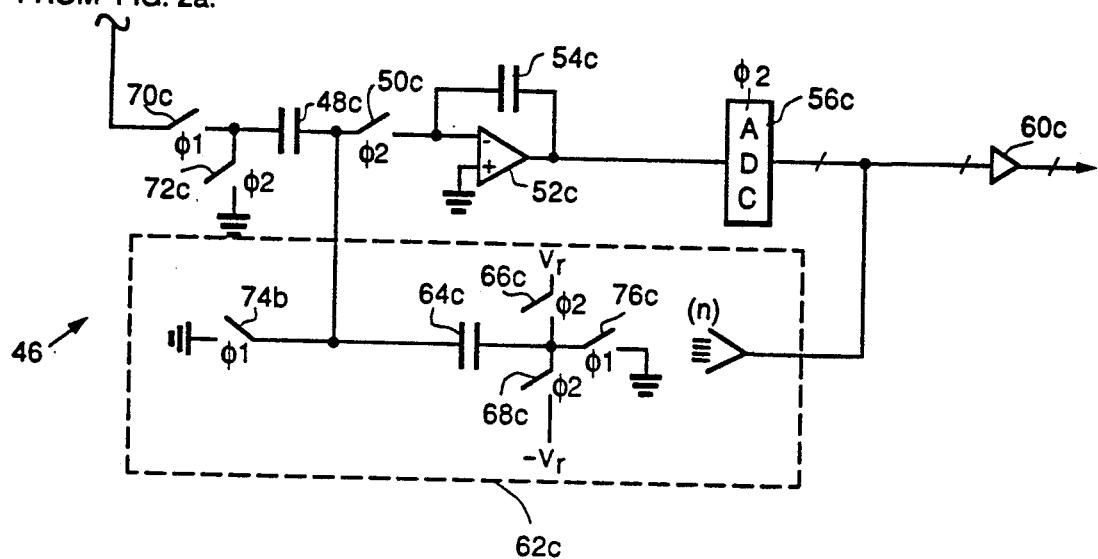

In the method and apparatus in accordance with the invention delaying integrators are used for connecting the sigma-delta loops as shown in FIGS. 2a and 2b. It will be understood that the method in accordance with the invention is shown with three loops here in the illustrated embodiment only for ease of description and is extendable, as required, to include more loops or to include higher order loops.

The analog-to-digital converter in accordance with the invention is illustrated in FIGS. 2a and 2b at 40. The illustrated converter comprises three loops 42, 44, and 46. As before, since the components of the three loops are similar the numbers of the corresponding elements in each loop will be distinguished by appended small letters.

Each loop comprises an input capacitor 48a, 48b, or 48c connected through respective switches 50a, 50b, 50c to amplifiers 52a, 52b, and 52c. Capacitors 54a, 54b, and 54c are connected between the inputs and outputs of the respective amplifiers. The output of the amplifiers are fed to respective Analog-to-Digital Converter (ADC) assemblies 56a, 56b, and 56c where the analog output voltage is converted to a digital signal, as described in conjunction with FIG. 1.

The outputs of ADC 56a and ADC 56b are provided to delay devices 58a (two unit delays) and 58b (one unit delay), respectively. The output of ADC 56c (FIG. 2b) is not delayed. The delayed and undelayed outputs of ADCs 56a–56c are multiplied as required, for example, as shown at buffer amplifiers 60a, and 60b, and 60c for further manipulation of the digital data. The digital output of the ADC's 56a–56c are also fed to respective Digital-to-Analog Converters (DAC's) indicated at boxes 62a, 62b, and 62c, respectively, the outputs of which are connected to the input of amplifiers 52a, b, and c. Each box 62a–62c contains a plurality (n) of DAC circuits, each constructed as shown, with (n) being equal to the number of bits of resolution.

The DAC's are preferably implemented as suitably switched capacitor DAC's, a simplified circuit of which is illustrated within the lines of the boxes 2a, b, and c. In these DAC's a selectable capacitor, one of which is indicated in each respective DAC at 64a, 64b, and 64c, is selected in accordance with the digital value received from the ADC and an appropriate reference voltage is selectably applied via switches 66a, 66b, 66c or switches 68a, 68b, 68c.

Switches 70a, 70b, and 70a serve to switchably connect the analog inputs to respective capacitors 48a, 48b, and 48c while switches 72a,b,c; 74a,b,c; and 76a,b,c switchably connect the various terminals to ground as required for operation of the device. A suitable switching arrangement in the DAC's is described, for example, in U.S. Pat. No. 5,162,801 issued Nov. 10, 1992, entitled "LOW NOISE SWITCHED CAPACITOR DIGITAL-TO-ANALOG CONVERTER" and assigned to the Assignee of the present invention.

In accordance with the invention, instead of the analog input and analog output from the amplifiers being directly applied to an input amplifier, as is shown in the prior art device of FIG. 1, for each loop they are applied to gain blocks illustrated here at 80 and 82. Blocks 80 and 82 comprise similar components and therefore will be numbered using the convention of small letters appended to a numeral to illustrate similar components in each block. Blocks 80 and 82 are preferably comprised of circuitry of a type described in commonly assigned U.S. patent application Ser. No. 855,985 filed Mar. 20, 1992, entitled "Switched Capacitor Amplifier Circuit Operating without Serially Coupled Amplifiers".

The analog input to each loop is selectably connected to each of capacitors 84a and 84b or 86a and 86b through switches 88a and 88b or 90a and 90b and the capacitors are selectably connectable to integrating amplifiers 92a and 92b through switches 94a and 94b or 96a and 96b.

The analog output of amplifiers 52a and 52b are also selectably applied respectively to capacitors 98a and 98b through switches 100a and 100b. A second terminal of each capacitor is selectably connected to the input of its respective integrating amplifier 92a or 92b through switches 102a and 102b. Switches 104a and 104b, 106a and 106b, 108a and 108b, 110a and 110b, 112a and 112b, and 114a and 114b each selectably connect a respective terminal of the various capacitors to ground as required.

As illustrated, capacitors 116a and 116b are connected between the input and output of respective gain amplifiers 92a and 92b. Switches 118a and 118b are connected to the terminals of respective capacitors 116a and 116b to selectably discharge them.

Figure 3:
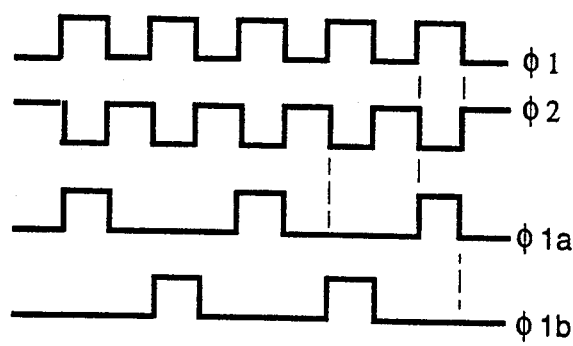
FIG. 3 shows the relationship of clock phases in the converter.

The operation of the first gain block 80 between the two loops 42 and 44 will now be described. On clock phase $\Phi 1$, (the relationship of the clock phases is shown in FIG. 3) the input $V_{in}$ is sampled on the loop's input capacitors, 48a and 48b, and on one of the gain blocks input capacitors, for example, 84a and 84b. On $\Phi 2$, the voltage held on 48a and 48b is integrated and sampled by the gain block capacitor 98a. At this point, capacitor 98a has been charged to the amplifier's output voltage which resulted from the input voltage being held by capacitors 48a. Thus, on the next $\Phi 1$, the held voltages on 48a and 98a (which are now in phase) are subtracted and multiplied by the gain at integrating amplifier 92a. The second and third loops are connected in a similar manner.

The integrating amplifiers all have two inputs. The DAC input is preferably non-delaying. As seen in FIG. 2, the DAC reference voltage is non-varying so that there are no disadvantages in using it as a non-delaying input. The other integrating amplifier input, $V_{in}$, however is rapidly varying. Since, in accordance with the invention, this input is now "delaying" (i.e., sampled and held) the gain block amplifiers, 92a and 92b only have to respond to a fixed non-varying voltage on clock phase $\Phi 2$, even though the input during clock phase $\Phi 1$ may be rapidly changing.

It will be understood that the subsequent loop digital output is one clock phase behind that of the previous loop. It will be appreciated that this can easily be dealt with in known manner, for example, by digital storage and subsequent summing of the values produced by the loops on each clock phase. It will also be understood that, as shown in FIG. 3 in conjunction with FIGS. 2a and 2b, for best results the input voltage is sampled by alternating capacitors on successive $\Phi 1$ clock phases.

While the invention has been particularly shown and described with respect to a preferred embodiment thereof, it will be understood by those skilled in the art that changes in form and details may be made therein without departing from the scope and spirit of the invention.

What is claimed is:

1. An analog-to-digital converter comprising a plurality of sigma-delta loops for converting a portion of an analog input to a quantized digital representation thereof, each loop having feedback and including a loop integration amplifier operative for converting an analog input to the loop and the feedback to a corresponding shaped respective analog representation of the analog input to the loop minus the feedback; and a plurality of gain blocks, each said gain block respectively connecting one pair of the plurality of loops, each said gain block comprising an amplifier, a first capacitor and a second capacitor alternatively switchably connected to the amplifier and operative for sampling an analog input on alternating first clock phases for providing first inputs to the amplifier and a third capacitor switchably connected to the amplifier and operative for sampling a corresponding analog output of the amplifier on a second clock phase to provide a second input to the amplifier, said amplifier being connected to receive and operate upon the first and second inputs on a succeeding clock phase, whereby the respective inputs are placed in phase at the input to the amplifier.

2. The apparatus of claim 1 wherein the operation in said gain block is a subtraction operation.

3. The apparatus of claim 1 wherein each said loop includes a digital-to-analog converter and the output from the digital-to-analog converter is a non-delaying input to the loop amplifier.

4. A method for cascading loops of a sigma-delta analog to digital converter comprising the steps of providing a plurality of sigma-delta loops, each loop comprising an analog-to-digital circuit which receives analog inputs and derives therefrom an analog output to be converted to digital format, switching the analog input respectively to a first capacitor and then to a second capacitor on successive first clock phases in order to sample a value of the analog input of at least one of said loops on a first phase and sampling a value of the output of said at least one loop on a second phase, and thereafter providing the sampled values as in-phase inputs to an amplifier having an output connected as an input to a subsequent loop, whereby the sampled input and output values may be subtracted in phase.

* * * * *